United States Patent [19]

Nabeshima et al.

[11] Patent Number: 5,296,095
[45] Date of Patent: Mar. 22, 1994

[54] METHOD OF DRY ETCHING

[75] Inventors: Yutaka Nabeshima, Katano; Tokuhiko Tamaki, Sakai, both of Japan

[73] Assignee: Matsushita Electric Industrial Co., Ltd., Osaka, Japan

[21] Appl. No.: 785,300

[22] Filed: Oct. 30, 1991

[30] Foreign Application Priority Data

Oct. 30, 1990 [JP] Japan .................................. 2-294663

[51] Int. Cl.$^5$ ............................................ H01L 21/00
[52] U.S. Cl. ..................... 156/662; 156/643; 156/646; 156/653; 156/657
[58] Field of Search ............... 156/643, 646, 662, 653, 156/657

[56] References Cited

U.S. PATENT DOCUMENTS 4,283,249 8/1981 Ephrath .............................. 156/345
4,678,539 7/1987 Tomita et al. ...................... 156/643

Primary Examiner—Brian E. Hearn
Assistant Examiner—George Goudreau
Attorney, Agent, or Firm—Ratner & Prestia

[57] ABSTRACT

A dry etching method for dry etching a silicon oxide film or a multilayer oxide film thereof which enables formation of contact window to good dimensional precision and with stable etching configuration in the process of film etching at submicron level. A compound gas containing a C element or S element or Cl element, and F element (e.g., $CF_4$) is used as a principal gas, and a compound gas containing a C element and two or more of H elements (e.g., $CH_2F_2$) as an additive gas is used, in the process of dry etching silicon oxide film or a multilayer film thereof. By using principal and additive gases having good step coverage of deposit produced by plasma reaction, it is possible to eliminate any etching residue and form contact windows having stable etching configuration and good dimensional accuracy in the process of film etching at submicron level. By using a compound gas containing a greater number of H element atoms than C element atoms, the deposit on the etching side wall can be a soluble one having a low F element content, such as $(C_xH_y)n$ polymer, and can be readily removed through after-etching washing.

4 Claims, 7 Drawing Sheets

| GAS | Tmin/Tmax [%] |
|---|---|
| $C_2Cl_2F_4$ | 4 |
| $CHF_3$ | 5 |
| $C_3F_8$ | 6 |
| $C_4F_8$ | 15 |
| $CH_2F_2$ | 25 |
| $CH_3Br$ | 25 |

METHOD OF DRY ETCHING

BACKGROUND OF THE INVENTION

1. Field of the Invention

The present invention relates to a method of dry etching a silicon oxide film or a multilayer oxide film thereof formed on a single-crystal or polycrystal silicon and, more particularly, to the selection of etching gases for etching a silicon oxide film on a silicon substrate with a gas plasma.

2. Description of the Prior Art

Recently, with the progress in the micronization of semiconductor devices, the etching process in the manufacturing of a semiconductor device tends to change from the conventional wet etching techniques utilizing chemical solution to dry etching techniques in which gases in plasma condition or ion beams are utilized. The latter dry etching technique has an advantage in that it involves little possibility of creating a pollution problem due to waste water disposal and makes micropattern processing possible. In addition, it makes it possible to apply a uniform etching treatment. The technique is now indispensable to the manufacture of VLSI in particular.

For purposes of dry etching a silicon oxide film or silicon nitride film formed on a silicon substrate, the following gas systems are employed as etching process gases for dry etching methods hitherto developed.

(A) a mixed gas of $CHF_3$ with $O_2$;
(B) a mixed gas of $CHF_3$ with other fluorocarbon gas, such as $CF_4$ or $C_2F_6$ etc.;
(C) a mixed gas of $C_4F_8$ with $CH_2F_2$ or $CH_3F$.

In order to dry etch the oxide film to good dimensional precision, it is necessary to form a deposit on the etching side wall to protect the etching side wall from ions and/or radicals in a plasma.

FIG. 4 is a sectional view of a process to form a contact window 6 by the etching treatment of using a conventional dry etching method, said process being an example of a method using a mixed gas mentioned in (A) above, using a diode parallel plates RIE system and under the conditions of $CHF_3:O_2:He=9:1:40$; a gas pressure of 100 m Torr; and RF power of 330 W (13.56 MHz). First, as shown in FIG. 4(a), a CVD oxide film 21 of 0.1 μm in thickness, a BPSG film 22 of 0.4 μm in thickness, a CVD oxide film 21 of 0.25 μm in thickness, and a BPSG film 22 of 0.45 μm in thickness are sequentially deposited on a single crystal silicon substrate 1 to form multilayer oxide films 2 having a total thickness of 1.2 μm, and then a resist 3 which serves as an etching mask is formed with an opening pattern 4 of 0.65 μm square on the multilayer oxide films 2. Next, as shown in FIG. 4(b), the multilayer oxide films 2 are etched using the resist 3 as a mask under the foregoing conditions. In this case, a deposit 5 is formed on the etching side wall. Further, as shown in FIG. 4(c), the resist 3 and the deposit 5 are removed to form the contact hole 6.

FIG. 5 is a sectional view of a process to form a contact hole 6 by an etching treatment using a conventional dry etching method, said process being an example of a method to use a mixed gas mentioned in (B) above, using a diode parallel plates RIE system, showing by way of example under the conditions of $CHF_3:C_2F_6:He=9:1:1$ (where, the number of H element atoms contained in the etching process gases is 0.82 times the number of C element atoms); a gas pressure of 100 m Torr; and RF power of 330 W (13.56 MHz). First, as shown in FIG. 5(a), a CVD oxide film 21 of 0.1 μm in thickness, a BPSG film 22 of 0.4 μm in thickness, a CVD oxide film 21 of 0.25 μm in thickness, and a BPSG film 22 of 0.45 μm in thickness are sequentially deposited on a single crystal silicon substrate 1 to form multilayer oxide films 2 having a total thickness of 1.2 μm, and then a resist 3 which serves as an etching mask is formed with an opening pattern 4 of 0.65 μm square on the multilayer oxide films 2. Next, as shown in FIG. 5(b), the multilayer oxide films 2 are etched using the resist 3 as a mask under the foregoing conditions. Further, as shown in FIG. 5(c), the resist 3 and the deposit 5 are removed to form the contact hole 6.

Similarly, FIG. 6 is also a sectional view of a process to form a contact hole 6 by etching treatment using a conventional dry etching method, said process being an example of a method to use a mixed gas mentioned in (B) above using a diode parallel plates RIE system, under the conditions of $CHF_3:CF_4:He=1:1:5$ (where, the number of H element atoms contained in the etching process gases is 0.5 times the number of C element atoms); a gas pressure of 100 m Torr; and RF power of 330 W (13.56 MHz). First, as shown in FIG. 6(a), a CVD oxide film 21 of 0.1 μm in thickness, a BPSG film 22 of 0.4 μm in thickness, a CVD oxide film 21 of 0.25 μm in thickness, and a BPSG film 22 of 0.45 μm in thickness are sequentially deposited on a single crystal silicon substrate 1 to form multi-layer oxide films 2 having a total thickness of 1.2 μm, and then resist 3 which serves as an etching mask is formed with an opening pattern 4 of 0.65 μm square on the multilayer oxide films 2. Next, as shown in FIG. 6(b), the multilayer oxide films 2 are etched using the resist 3 as a mask under the foregoing conditions. Further, as shown in FIG. 5(c), the resist 3 and the deposit 5 are removed to form the contact hole 6.

FIG. 7(b) shows the ratio of minimum thickness to maximum thickness, Tmin/Tmax (hereinafter referred to as step coverage), of a deposit 5 produced by plasma reaction as deposited on a vertically stepped surface as shown in FIG. 7(a), which ratio differs according to the kind of gas used as shown.

In the above described conventional dry etching method, in the case of the mixed gas shown in (A) above, a large amount of O radicals is produced to react with the resist 3 and, therefore, as shown in FIG. 4(b), the end of the resist 3 retreats from the dotted line to the solid line. The deposit 5 which has been deposited to protect the side wall of the contact hole 6 also diminishes as it reacts with O radicals. As a consequence, the contact window 6 is dimensionally enlarged to the extent that, as shown in FIGS. 4(a) and 4(c), the contact window 6 is widened from the resist opening pattern 4 of 0.65 μm square to a size of 0.85 μm square, which means a considerable decrease in pattern transfer precision.

In the case where the mixed gas shown in (B) above is used, because the $CHF_3$ is used therein, and the step coverage is as small as 5% as shown in FIG. 7(b), therefore, the deposit 5 attached to the side wall of the contact hole is considerably smaller despite the fact that the number of H element atoms contained in the etching process gases is 0.82 times the number of C element atoms. Consequently, as is the case with the mixed gas mentioned in (A) above, the effect of the deposit for protecting the side wall of the contact hole 6 is reduced, so that the size A of the contact hole is enlarged; and thus, as shown in FIG. 5(a) and 5(c), the contact window 6 formed on the basis of the resist opening pattern 4 of 0.65 μm square is widened to 0.9 μm square, which also means a considerable decrease in pattern transfer accuracy.

Furthermore, even when the quantity of the deposit on the etching side wall is increased using the mixed gas of (B) above, with changed proportions of ingredients therein, the step coverage of the deposit 5 produced by plasma reaction as shown in FIG. 5 using $CHF_3$ is as small as 5% and, therefore, as shown in FIG. 6(b) minute configurational changes of the etching side wall which occur as a consequence of the etching rate difference due to the film species of multilayer oxide films 2 are often reflected as a film thickness irregularity of the deposit 5 attached to the etching side wall. Further, said deposit 5 is composed of slightly soluble materials such as $(C_xF_z)n$ polymer, which have a high percentage content of F element, and, therefore, is hard to remove in the washing step of an after-processing. Thus, as shown in FIG. 6(c), a deposit 5 as an etching residue is present on the side wall of the contact hole.

In the case of the mixed gas shown in (C) above, while the step coverage of $CH_2F_2$ or $CH_3F$, as an additive gas for configuration control is good, the step coverage of $C_4F_8$ of principal gas is poor, which eventually poses a problem similar to that in the case of the mixed gas (B).

As a result of the investigation of the present inventors, it has been found that the foregoing method involves the following problems. When such a gas that the step coverage of the deposit produced by plasma reaction is low in the order of 5% is used, the amount of the deposit 5 attached to the etching side wall is small despite the fact that the number of H element atoms contained in the etching process gases is 0.65 or less times the number of C element atoms. That is to say, etching is carried out under conditions which would result in greater polymer production. As a consequence, the effect of protection of the etching side wall is reduced and, therefore, the etching size is extended. It being thus impossible to form such dimensionally accurate contact holes as shown in FIGS. 2 and 3 in the process of microfine working at submicron level through dry etching.

Next, even when the amount of deposit 5 attached to the etching side wall is increased by changing the proportions of component gases in the mixed gas, where such a gas that the step coverage of the deposit produced by plasma reaction is low is used, minute configurational changes on the etching side wall which result from the difference on etching rate between the different component films of the multilayer oxide films 2 are largely reflected as interlayer variations in the deposit 5 attached to the etching side wall. Further, since the deposit 5 is a less soluble product composed of a material having a high F element content, e.g., $(C_xF_z)n$ polymer, the deposit is hard to remove in the washing step of an after-etching stage. Therefore, as shown in FIG. 6(c), a deposit 5 as an etching residue is present on the side wall of the contact hole, with the result that the stability of the etching configuration is unfavorably affected.

This invention has been developed in view of the foregoing drawbacks of the prior art, and accordingly it is a primary objective of the invention to provide a dry etching method which enables dimensionally accurate formation of contact windows in the process of superfine working at submicron level and assures good stability of etching configuration.

SUMMARY OF THE INVENTION

The method of dry etching of the present invention, which overcomes the above-discussed and numerous other disadvantages and deficiencies of the prior art, comprises a method of dry etching a silicon oxide or a multilayer oxide film thereof by using a principal etching gas and an additive gas, characterized in that the principal etching gas is a gas of compound containing a C element or an S element or a Cl element together with an F element, and the additive gas is a gas of compound containing a C element and two or more of H elements.

In an embodiment, the present invention provides a dry etching method characterized by using the etching gases in such a manner that the number of H element atoms contained in the gases is 0.65 or less times the number of C element atoms.

In an embodiment, a dry etching method is provided, the method being characterized by using the mixed gas of $CH_2F_2$, $CH_3F$, or $CH_3Br$ as the additive gas with $CF_4$ as the principal gas.

In an embodiment, a dry etching method is provided, the method being characterized by diluting the etching gases with an inert gas.

In an embodiment, a dry etching method is provided, the method being characterized by containing the multilayer film of a plurality of different etching rate films.

Thus, the invention described herein makes possible the primary objective of providing a dry etching method which enables dimensionally an accurate formation of contact windows in the process of superfine working at submicron level and assures good stability at etching configuration.

BRIEF DESCRIPTION OF THE DRAWINGS

This invention may be better understood and its numerous objectives and advantages will become apparent to those skilled in the art by reference to the accompanying drawings as follows.

DESCRIPTION OF THE PREFERRED EMBODIMENTS

According to the above described method of the invention, the deposit is deposited on the etching side wall to a predetermined thickness, without being dependent on such minute configurational changes on the etching side wall due to the difference in etching rate between different kinds of component films of the multilayer oxide films. Therefore, a steady etching configuration can be produced to good dimensional precision in the process of fine etching of submicron level.

As a result of experiments conducted by the present inventors using a variety of combinations of gases, it has been found that in order to obtain a particularly smooth etching side wall and good dimensional precision of 0.05 $\mu$m or less, it is only required that the step coverage of a deposit resulting from the use of a principal gas and an additive gas be 20% or more. If the step coverage is less than 20%, minute configurational changes on the etching side wall due to differences in etching rate between different kinds of component films of the multilayer oxide film are reflected to a large measure as thickness variations of the deposit 5 attached to the etching side wall. This results in the surface roughness or thickness variations of the side wall. By using as an additive gas a compound gas containing a C element and two or more of H element and, in particular, by arranging that the number of H elements atoms contained in the etching process gases is 0.65 or less times the number of C element atoms, the step coverage can be increased to 20% or more. In this way, it is possible to form contact holes to good dimensional precision in the process of fine working of submicron level. Furthermore, the deposit in this case is a soluble deposit composed of a material of a low F element content, such as $(C_xH_y)n$ polymer and can, therefore, be easily removed in the washing step of the after-etching stage.

EXAMPLES

Figure 1A:
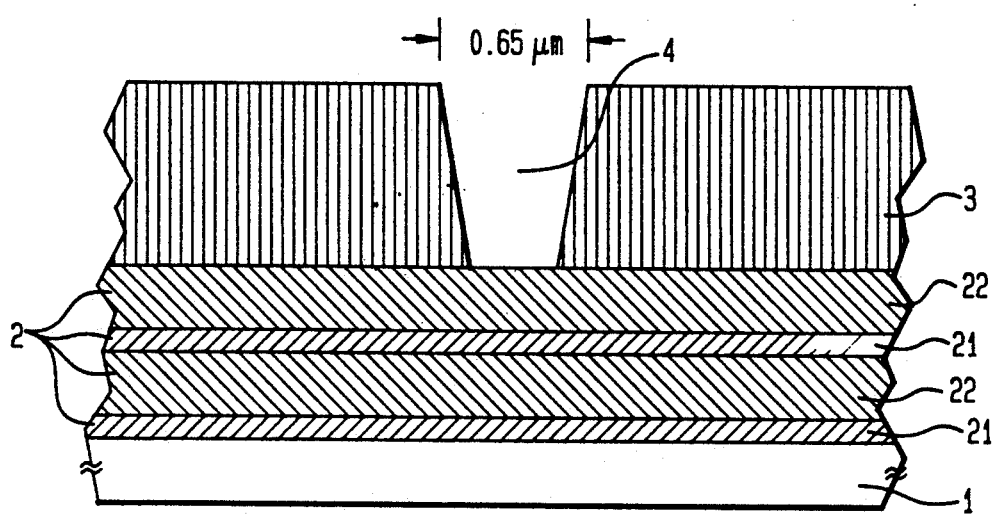
FIGS. 1a–1c are a sectional view showing the process of dry etching in one example of the method of the invention.
Figure 1B:
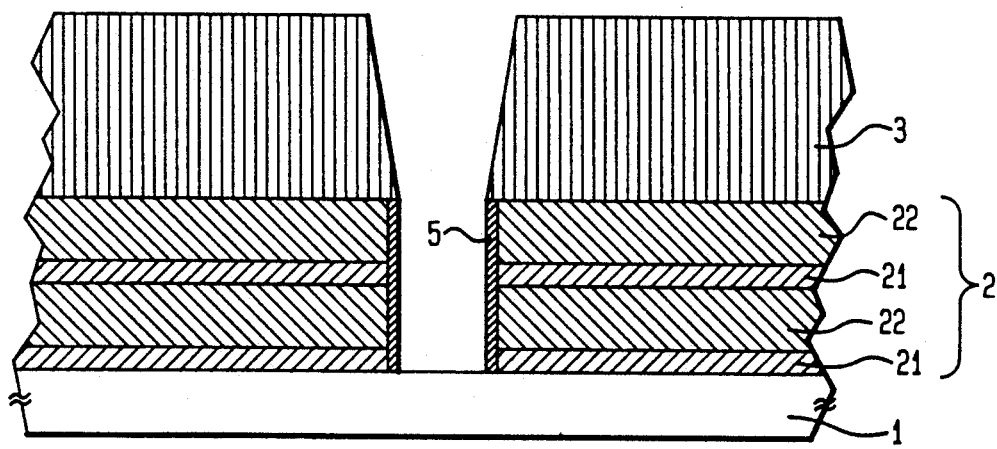
Figure 1C:
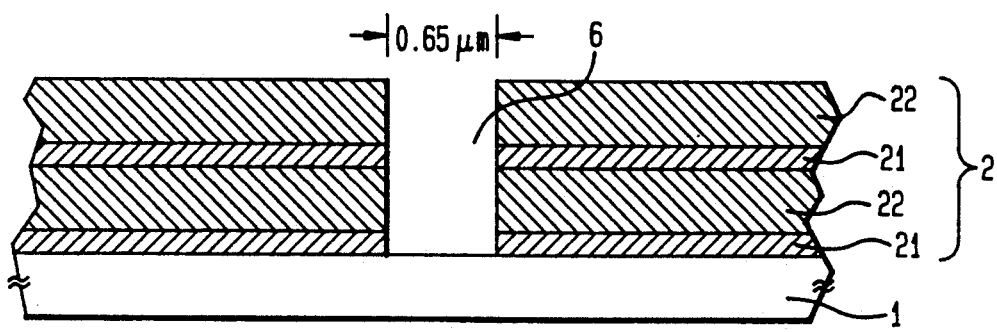

FIG. 1 shows a sectional view of the process of etching in one example of the method of the invention. As shown in FIG. 1(a), a non-doped CVD oxide film 21 of 0.1 $\mu$m in thickness, a BPSG (where, B: 8 wt %, p: 8 wt %) film 22 of 0.4 $\mu$m in thickness, a CVD oxide film 21 of 0.25 $\mu$m in thickness, and a BPSG film 22 of 0.45 $\mu$m in thickness are sequentially deposited on a single crystal silicon substrate 1 to form a multilayer oxide film 2 having a total thickness of 1.2 $\mu$m, and then a resist 3 which serves as an etching mask is formed with an opening pattern 4 of 0.65 $\mu$m square on the multilayer oxide film 2. Next, as shown in FIG. 1(b), the multilayer oxide films 2 are etched under the conditions of $CH_2F_2:CF_4:He=1:3:10$ (where, $CF_4$: principal etching gas: $CH_2F_2$: additive gas for configuration control; the number of H elements contained in the etching process gases is 0.5 time the number of C element atoms), gas pressure of 80 m Torr, and RF power of 330 W (13.56 MHz). Then, as shown in FIG. 1(c), the resist 3 and deposit 5 are removed to form a contact hole 6.

Figure 4A:
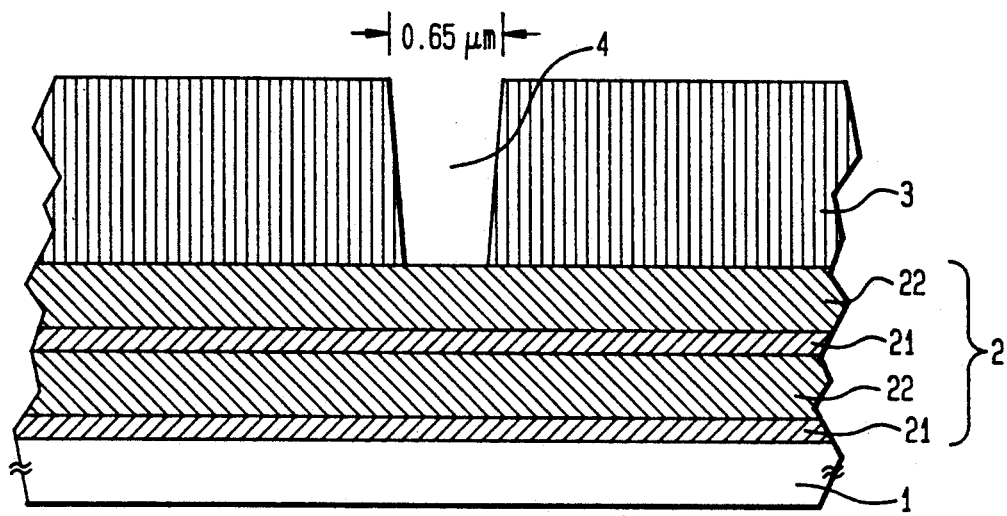
FIGS. 4a–4c are a sectional view showing the process of dry etching in the prior art using a mixture gas of $CHF_3$ and $O_2$.
Figure 4B:
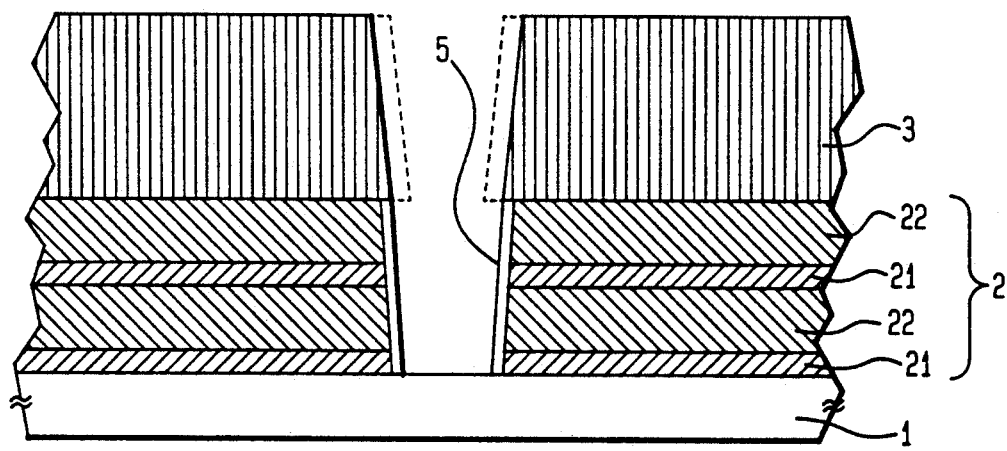
Figure 4C:
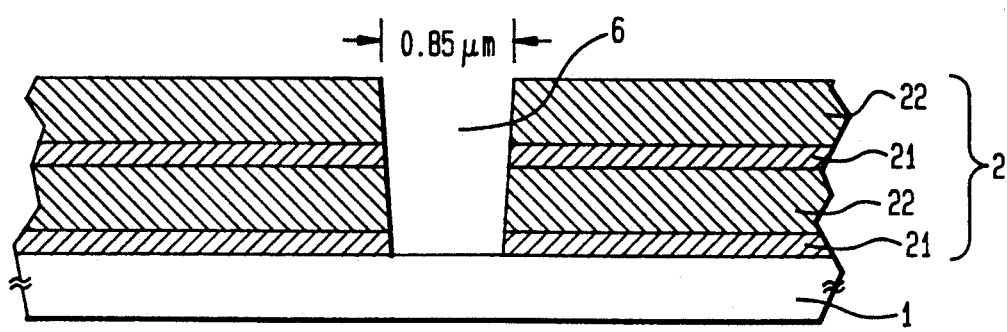
Figure 5A:
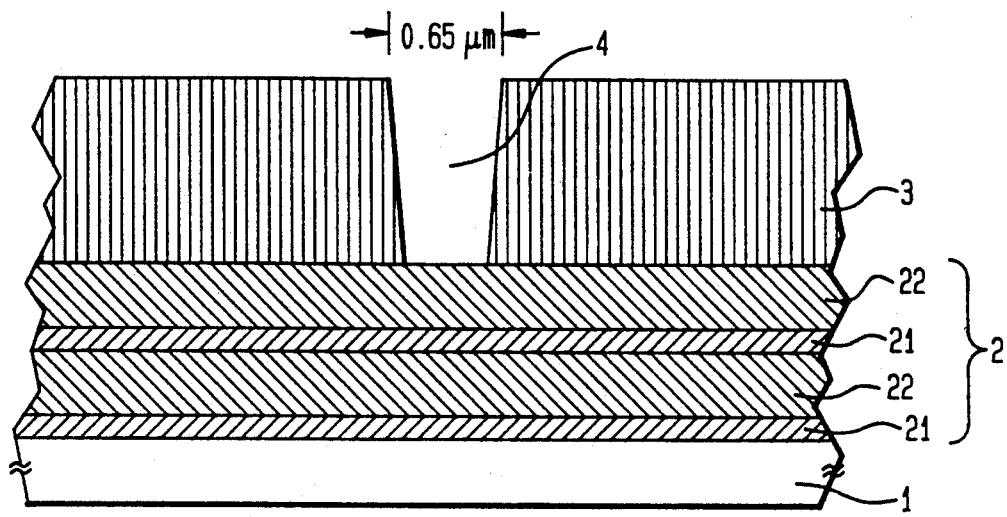
FIGS. 5a–5c are a sectional view showing the process of dry etching in the prior art using a mixture gas of $CHF_3$ and $C_2F_6$.
Figure 5B:
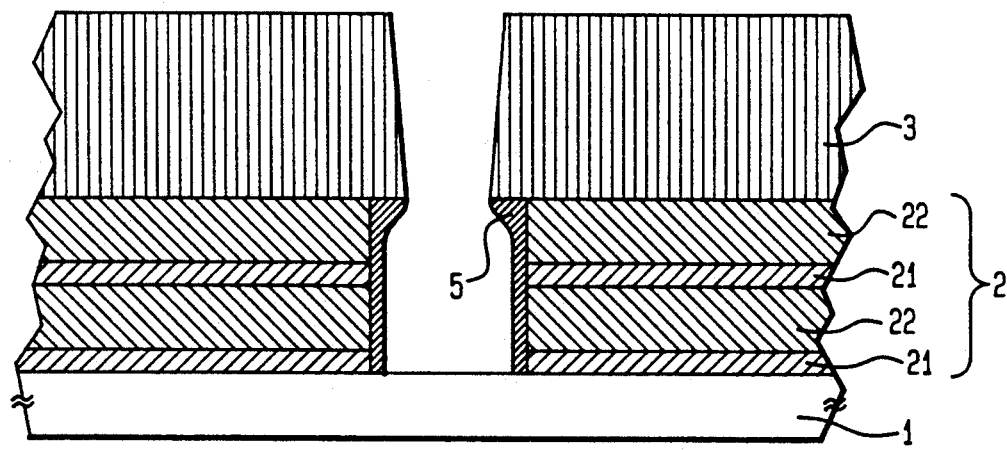
Figure 5C:
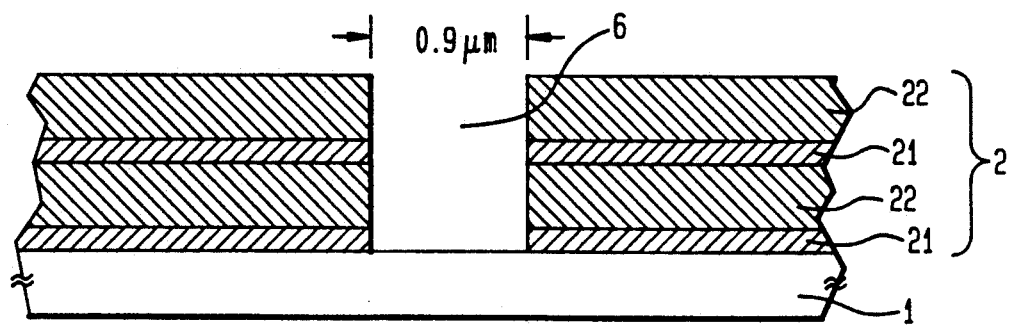
Figure 6A:
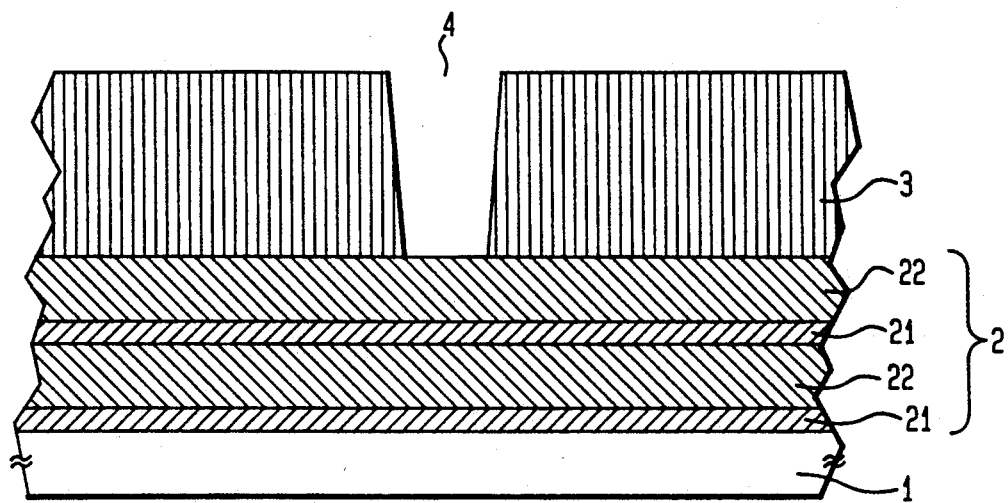
FIGS. 6a–6c are a sectional view showing the process of dry etching in the prior art using a mixture gas of $CHF_3$ and $CF_4$.
Figure 6B:
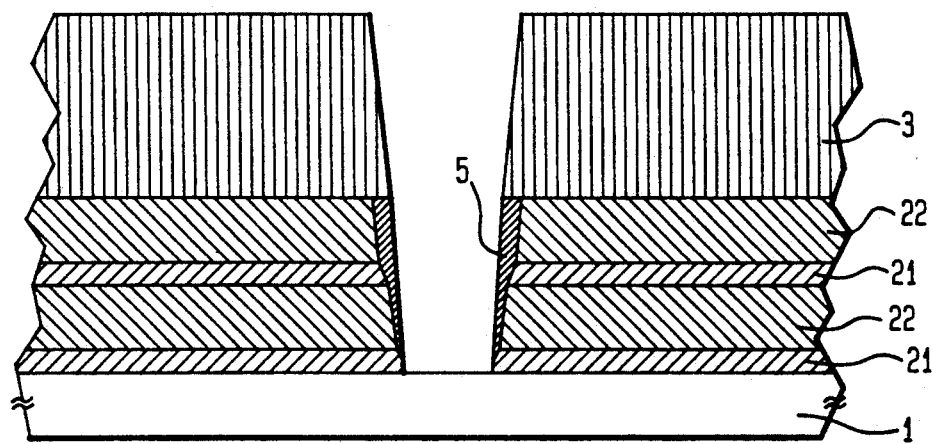
Figure 6C:
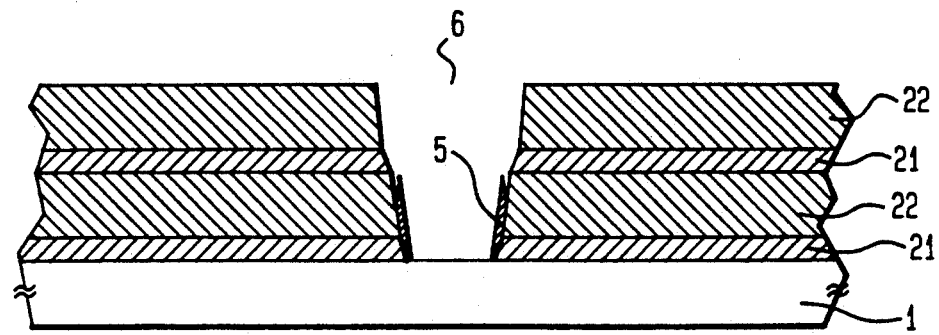
Figures 7A, 7B:
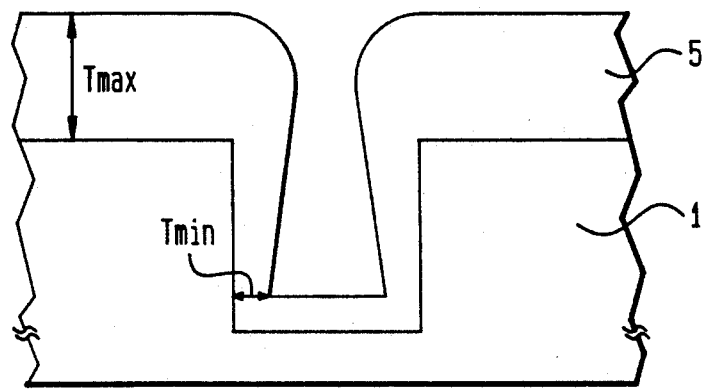
FIGS. 7(a) and 7(b) show the correlationship between kind of gas and step coverage.

In the above exemplified method of dry etching, the manner of operation will be explained. Unlike $C_4F_8$ and $C_3F_8$, the $CF_4$ does not contribute to depositing. Further, $CH_2F_2$ is an additive gas of the type in which the step coverage of the deposit produced by plasma reaction as defined in FIG. 5 is 20% and more (25%) and therefore, the deposit is attached to the etching side wall to a predetermined thickness, without being subject to minute configurational changes in the etching side wall which result from such difference in etching rate between different kinds of component films of the multilayer oxide film as shown in FIG. 4. It has been reported that $C_3F_8$ and $C_4F_8$ are used as the principal etching gas, and $CH_2F_2$ is used as an additive gas, but it is noted that even if $CH_2F_2$, a gas having good step coverage is used, $C_3F_8$ and $C_4F_8$ are unsuitable for use, because they tend to form a deposit having poor step coverage. A deposit formed by $CH_2F_2$ is higher in the proportion of H element to F element as compared with those formed by $CHF_3$, $C_3F_8$, etc., and is therefore lower in F element content as compared with deposits formed by $CHF_3$, $C_3F_8$, etc. In other words it is a soluble material composed of, for example, a $(C_xH_y)n$ polymer. Therefore, the deposit can be easily removed in the washing step of the after-etching stage and can be made free of etching residue, it being thus possible to form stable etching configuration to good precision.

In the foregoing example, $CF_4$ was used as the principal etching gas. However, a gas, such as $SF_6$ or $ClF_3$, which does not produce a deposit, may be used, in which case an equivalent result can be obtained simply by changing the gas ratio.

In the example, $CH_2F_2$ was used as an additive gas. Needless to say however, any other gas, such as $CH_3F$ or $CH_3Br$, may be used as an additive gas insofar that it is a gas such that the step coverage of the deposit produced by plasma reaction is 20% or more.

Again, in the example, $CH_2F_2$ was used as a compound gas containing a greater number of H element atoms than C element atoms. Needless to say, any other gas, such as $CH_3F$ or $CH_3Br$ etc., may be used insofar as it is a compound gas containing a greater number of H element atoms than C element atoms.

Although $CF_4$ was used as principal gas in the example, a similar result was also obtained where some other compound gas containing at least one C element and one F element was used.

He gas was used as a dilute gas, but alternatively Ar may be used as such. It is noted that even where no dilute gas was used, a similar result was obtained.

Diode parallel plates RIE system was employed as the etching system. Alternatively, any other system, such as triode RIE system, magnetron RIE system, or ECR system, may be employed to obtain a similar result.

In the foregoing example, a contact window of 0.65 $\mu$m square was formed on the multilayer oxide films. Needless to say, this method is applicable to any process of oxide film etching where dimensional accuracy is required.

Next, one example in which the fine etching method of the invention is applied to an actual device is given.

Figure 2:
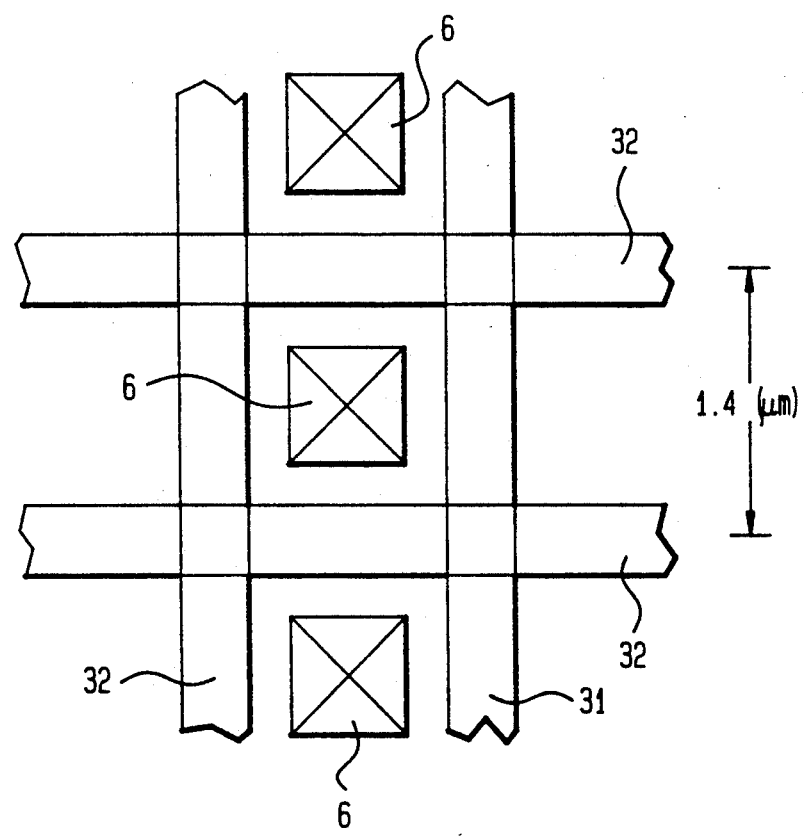
FIG. 2 is a fragmentary schematic plan view of a 16MDRAM cell area.

FIG. 2 is a fragmentary schematic plan view showing a cell portion of a 16MDRAM. For the sake of simplicity, a word line 31, bit lines 32, and contact holes 6 for storage nodes are only shown. As can be clearly seen from the figure, the cell pitch is 1.4 $\mu$m, and a contact hole 6 is required to be formed in each area surrounded by word line 31 and bit lines 32.

Figure 3A:
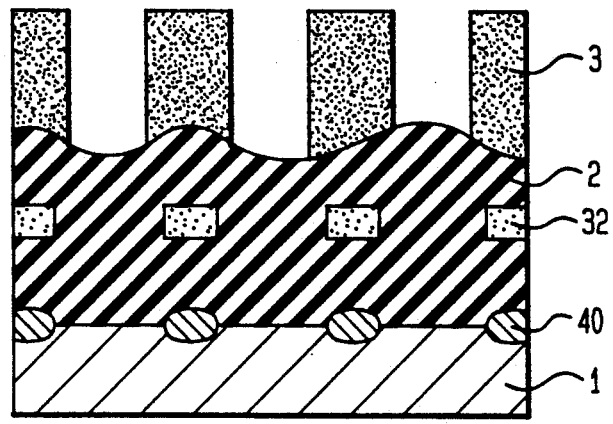
FIGS. 3a–3c are a sectional view of the process of contact etching for storage nodes of the 16MDRAM to which the invention is applied, as viewed in the direction of bit lines of the cell area.
Figure 3B:
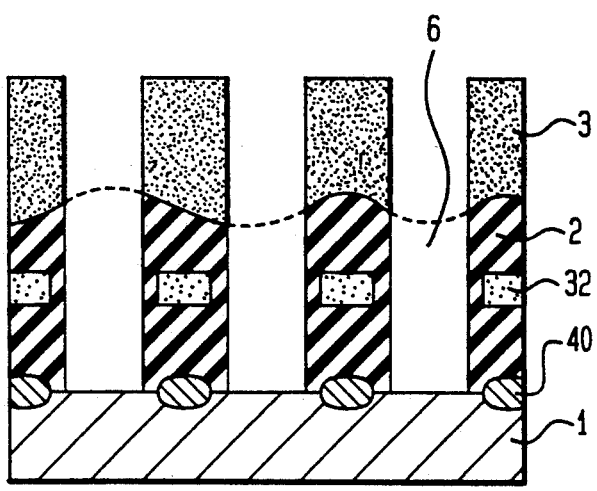
Figure 3C:
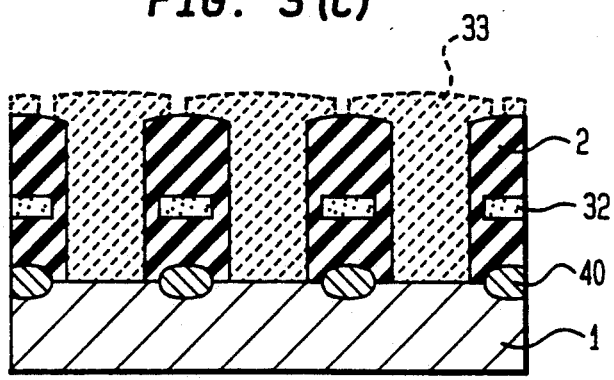

FIG. 3(a) is a sectional view of the etching process for the cell region as viewed in the direction of the bit line when the invention is applied for storage node contact etching for the 16MDRAM. The figure corresponds to a section taken on line III—III' in FIG. 2. In FIG. 3(a), numeral 1 designates a silicon substrate, 40 designates LOCOS oxide film as a device separation area, 32 designates a bit line, 2 designates a multilayer oxide film of the same configuration as that in FIG. 1, 3 designates a photo resist patterned for storage node contact. A contact hole 6 is formed in the oxide film layer 2 for each area surrounded by word line and bit lines (see FIG. 3(b)). Then, storage nodes 33 are formed (FIG. 3(c)).

Resolution limits for stepper and mask registering accuracy assume finite values. Therefore, when a dimensional shift occurs in FIG. 3(b), contact hole 6 contacts word line 31 and bit lines 32, and eventually shorting is caused between storage node 33 and word line 31 and/or bit line 32.

According to the method of the invention, a deposit is deposited on the etching side wall to a predetermined thickness, without being subject to any minute configurational change resulting from the difference of etching rate between different kinds of films of the multilayer film. Therefore, window holes of stable configuration can be formed with good dimensional precision in the process of fine etching of micron level.

As described above, according to the invention, a compound gas containing a C element or S element or Cl element is used as a principal etching gas, and a compound gas containing a C element and two or more H elements is as an additive gas, in the process of dry etching a silicon oxide film or a multilayer film thereof, in the process of fine etching of submicron level whereby any possible etching residue can be eliminated and contact holes of stable configuration can be formed to satisfactory precision.

By using a compound gas containing greater number of H element atoms than C element atoms, the number of H element atoms in the etching process gases can be made smaller than 0.65 times the number of C element atoms, so that deposits are more liable to be deposited on the etching side wall. Therefore, contact windows can be formed with good dimensional accuracy in the process of fine etching at submicron level. Further, since such a deposit is a well-soluble one having a low F element content, such as $(C_xH_y)n$ polymer, the deposit can be easily removed in the washing step of after etching stage.

Another advantage of the invention witnessed in an example other than the foregoing, by using a compound gas containing a greater number of H element atoms than C element atoms, the number of H element atoms contained in the etching process gases can be made smaller than 0.65 times the number of C element atoms. This provides for a reduction of the cause of pollution and foreign matter in the etching workshop. Thus, the invention can be employed with great advantages over the prior art.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of dry etching a silicon oxide or a multilayer oxide film thereof by using a principal etching gas and an additive gas, wherein said additive gas consisting essentially of $CH_2F_2$, $CH_3F$ or $CH_3Br$ and said principal gas consisting essentially of $CF_4$, $SF_6$ or $ClF_3$.

2. A dry etching method as claimed in claim 1, characterized by using the etching gases in such a manner that the number of H element atoms contained in the gases is 0.65 or less time the number of C element atoms.

3. A dry etching method as claimed in claim 1, characterized by diluting the etching gases with an inert gas.

4. A dry etching method as claimed in claim 4, characterized by containing the multilayer oxide film of a plurality of different etching rate films.

* * * * *

UNITED STATES PATENT AND TRADEMARK OFFICE
CERTIFICATE OF CORRECTION

PATENT NO. : 5,296,095
DATED : March 22, 1994
INVENTOR(S) : Nabeshima et al.

It is certified that error appears in the above-indentified patent and that said Letters Patent is hereby corrected as shown below:

Column 8, line 36, after "claim" the number "4" should be --1--.

Signed and Sealed this

Twenty-fifth Day of October, 1994

Attest:

BRUCE LEHMAN

*Attesting Officer*  *Commissioner of Patents and Trademarks*